United States Patent [19]

Larson

[11] Patent Number: 4,626,824

[45] Date of Patent: Dec. 2, 1986

[54] APPARATUS AND ALGORITHM FOR COMPRESSING AND DECOMPRESSING DATA

[75] Inventor: Lawrence E. Larson, Vestal, N.Y.

[73] Assignee: International Business Machines Corporation, Armonk, N.Y.

[21] Appl. No.: 743,443

[22] Filed: Jun. 11, 1985

[51] Int. Cl.[4] ............................................. H03K 13/00
[52] U.S. Cl. .............................. 340/347 DD; 358/261
[58] Field of Search ............... 340/347 DD; 358/260, 358/261; 364/900

[56] References Cited

U.S. PATENT DOCUMENTS

| | | | |
|---|---|---|---|
| 4,117,470 | 9/1978 | Elliott ...................... | 340/347 DD X |
| 4,192,010 | 3/1980 | Kerner et al. ........... | 340/347 DD X |
| 4,420,771 | 12/1983 | Pirsch .................................. | 358/261 |
| 4,542,515 | 9/1985 | Gutleber ................. | 340/347 DD X |

*Primary Examiner*—William M. Shoop, Jr.
*Assistant Examiner*—Sharon D. Logan
*Attorney, Agent, or Firm*—John H. Bouchard

[57] ABSTRACT

A compression and a decompression algorithm resides in a memory of a data processing system. The data processing system communicates to another data processing system via an input/output means and a telecommunications network. When a message, to be communicated to the other data processing system, is ready for transmission, the data processing system compresses the message data. A processor of the data processing system compresses the data using the compression algorithm stored in the memory of the data processing system. The compression algorithm: identifies a mask character in the data representing the most frequently occurring character in the data, develops a mask byte in association with the mask character, the mask byte identifying the locations of the mask character in the data and identifying the locations of each portion of a residual message associated with the data, and develops the residual message, the residual message representing the message data with the mask character extracted from the message data.

8 Claims, 7 Drawing Figures

FIG. 3A

[CHAR1] [10011] [(BYTE1)(BYTE2)]
  30A     30B      30C

FIG. 3B

[(CHAR1)(BYTE1)(BYTE2)(CHAR1)(CHAR1)]

FIG. 3C (1)  [MESSAGE]
(2)  [CH1][MB1] [RM1]
(3)  [CH1][MB1] [CH2][MB2] [RM2]
(4)  [CH1][MB1] [CH2][MB2] [CH3][MB3] [RM3]

APPARATUS AND ALGORITHM FOR COMPRESSING AND DECOMPRESSING DATA

BACKGROUND OF THE INVENTION

1. Field of the Invention

The subject matter of the present invention pertains to computer systems, and more particularly, to a data compression and decompression algorithm used in the computer system for compressing message data destined to be transmitted over a link and for decompressing the message data when the message has been received from the link.

2. Description of the Prior Art

When a message must be transmitted over a message channel, it is often necessary to compress the message data prior to transmission. This compression is necessary because of the time required to transmit the message across the message channel. The time to be considered is the transmission time of the compressed message, which is directly related to the length of the message, plus the time to develop the compressed message. A typical prior art method for compressing data is the so-called "Limple Ziv" compression method. The Limple Ziv message data compression technique required the utilization of a large processor. Furthermore, a large number of tables were needed, in storage, for use by the processor in performing the Limple Ziv compression technique. The Limple Ziv compression technique was not adaptable for use on a processor disposed within a personal computer. Several other compression techniques of the prior art, such as the technique disclosed in U.S. Pat. No. 4,491,934 to Heinz entitled "Data Compression Algorithm", fail to disclose, teach, or suggest the fact that a message, once compressed, could be re-compressable thereby creating a re-compressed message having a message data length which is even smaller than the length of the original compressed message.

SUMMARY OF THE INVENTION

Accordingly, it is a primary object of the present invention to provide a compression and de-compression algorithm for a computer system, the compression algorithm, in association with the computer system hardware, being capable of continually and repeatedly compressing message data until the data can no longer be compressed, the algorithm performing this function using only the data present in the message itself.

These and other objects of the present invention are accomplished by providing a compression algorithm which utilizes the message itself to perform the compression function. No external tables are necessary to perform the data compression function of the present invention. In accordance with the present invention, the compression algorithm, in association with the computer system hardware, surveys the message to be compressed to determine if the message length, as indicated by a length indicator, is longer in length than a reference modulus number. If it is, the algorithm identifies a mask character, the mask character being the character which occurs most frequently in the message. The algorithm then compares the mask character with each byte of the message, each byte representing each character of the message. If the mask character compares exactly with the first byte of the message, a "1" is placed in the first position of a special location called a mask byte. If the mask character does not compare with the first byte of the message, a "0" is placed in the first position of the mask byte. When all comparisons are made between the mask character and each byte of the message, a complete mask byte (comprised of 1's and 0's) has been constructed. A residual message consists of the bytes of the message which did not compare exactly with the mask character. The new compressed message then comprises the length indicator, the modulus number, the mask character, the mask byte, and the residual message. The residual message undergoes the same compression process as described above, the compression process continuing until the length of a subsequently compressed message is greater than the length of a previously compressed message. The previously compressed message is then transmitted over a data channel. On a receiving end, to re-create the original message, the mask character and the residual message is compared with the mask byte. If a "1" appears in the first position of the mask byte, the mask character is used as the first character of the original message whereas, if a "0" appears in the first position of the mask byte, the character represented by the first byte of the residual message is used as the first character of the original message. The process of de-compressing the remaining positions of the mask byte continues in the same manner as described above.

Further scope of applicability of the present invention will become apparent from the detailed description presented hereinafter. It should be understood, however, that the detailed description and the specific examples, while representing a preferred embodiment of the invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein:

FIGS. 3a through 3e illustrate the compression process and the decompression process in accordance with the present invention;

DETAILED DESCRIPTION OF THE PREFERRED EMBODIMENT

Figure 1:
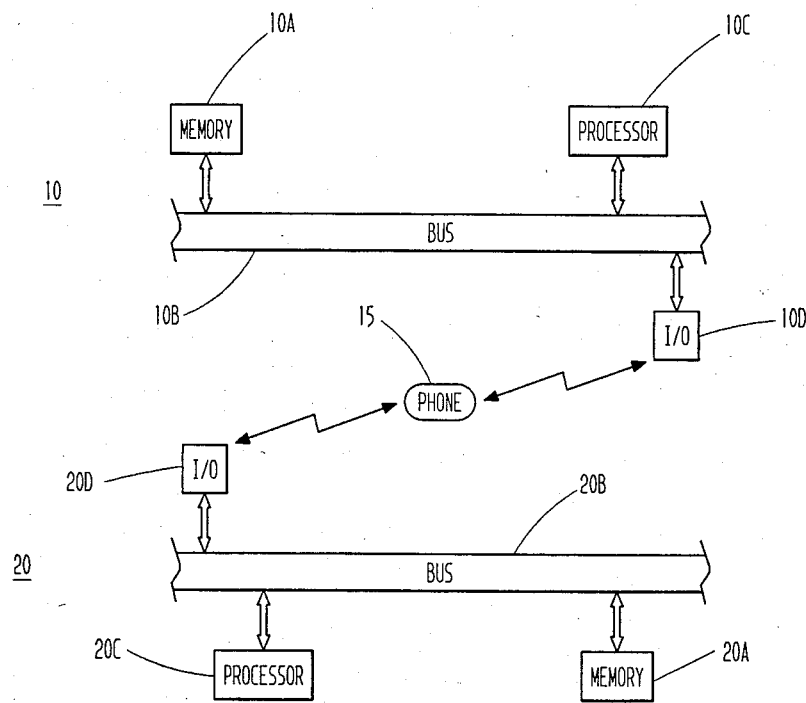
FIG. 1 illustrates a block diagram of a typical data processing system incorporating the compression and decompression algorithms of the present invention.

Referring to FIG. 1, typical data processing systems are illustrated. In FIG. 1, a first, transmitting data processing system 10 includes a memory 10a connected to a system bus 10b, a processor 10c connected to the system bus 10b, and an input/output (I/O) peripheral device 10d connected to the system bus 10b. The processor 10c executes the instructions contained in memory 10a and transmits the results to the I/O device 10d. A phone 15 is connected to the I/O device 10d and receives the transmitted results from the I/O device 10d. The phone 15 is further connected to a second, receiving data processing system 20, the phone 15 retransmitting the results received from the I/O device 10d to the second data processing system 20. The second data processing system 20 includes an input/output (I/O) peripheral device 20d connected to a system bus 20b, a processor 20c connected to the system bus 20b, and a memory 20a connected to the system bus 20b. The processor 20c executes the instruction stored in memory 20a. When the results are received from the first data processing system 10 via phone 15, the processor 20 executes the instructions stored in memory 20a for the purpose of interpreting the results received from the first data processing system 10 or performing some other function with respect to the results.

Figure 2:
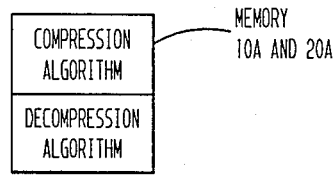
FIG. 2 illustrates, schematically, the contents of each memory shown in FIG. 1.

Referring to FIG. 2, a schematic representation of the contents of memory 10a and 20a is illustrated. Memory 10a and memory 20a each contain a compression algorithm and a decompression algorithm stored therein. The compression algorithm, in association with the computer system hardware, compresses the message data utilizing only the data present in the message itself. The decompression algorithm extracts the original message data from the compressed message data.

Referring to FIG. 1 in association with FIG. 2, processor 10c of the first data processing system 10 contains message data which must be transmitted to processor 20c of the second data processing system 20. Processor 10c executes the instructions associated with the compression algorithm stored in memory 10a, compressing the message data stored in the cache of processor 10c. The compressed message data is transmitted to the second data processing system 20 via I/O device 10d and phone 15 and is received by I/O device 20d. The processor 20c executes the instructions associated with the decompression algorithm stored in memory 20a, decompressing the compressed message data received from the first data processing system 10. As a result, the original message data, originally stored in the cache of processor 10c, is extracted from the compressed message data and stored in the cache of processor 20c. Since memory 20a contains the same compression algorithm as present in memory 10a, the message data present in the cache of processor 20c can be compressed in the same fashion that it was compressed via use of processor 10c. Similarly, processor 10c can perform a decompressing function using the decompression algorithm stored in memory 10a.

The data processing systems shown in FIG. 1 may be any typical data processing system. For example, data processing systems 10 and 20 may be the system set forth in a manual entitled "IBM System/370 Principles of Operation", developed by International Business Machines, Corp., GA22-7000, the disclosure of which is incorporated by reference into the specification of this application.

Referring to FIGS. 3a through 3c, the compression process and decompression process of the present invention is illustrated. In FIG. 3b, a typical example message is illustrated. This example message is utilized for purposes of illustration only and is not intended to be illustrative of an actual portion of message data. The message of FIG. 3b comprises a byte of data representative of a first character, char1, followed by another data byte, byte1, followed by another data byte, byte2, followed by the byte of data representative of the first character, char1, followed by the byte of data representative of the first character, char1.

In FIG. 3b, note that five data bytes are illustrated: char1, byte1, byte2, char1, and char1. Upon examining the five data bytes, it is evident that the byte "char1" occurs most frequently. The most frequently occurring byte, in this case "char1", is termed a "mask character".

Referring to FIG. 3a, a compressed message based on the message of FIG. 3b is illustrated. In general, a compressed message comprises the mask character, followed by a mask byte, followed by a residual message. In our example shown in FIG. 3a, the compressed message 30 comprises the mask character "char1" 30a, followed by the mask byte 30b, followed by the residual message 30c.

The compressed message of FIG. 3a is synthesized from the original message of FIG. 3b in the following manner: the mask character 30a is identified by determining the most frequently occurring character in each byte of the message data. In our example, "char1" is the most frequently occurring character. Therefore, "char1" is the mask character 30a. The mask byte 30b is constructed by comparing the mask character 30a with each byte of the original message shown in FIG. 3b. If the mask character 30a is the same character as that which is represented by the first byte of the message, a "1" is assigned to a first position of the mask byte 30b; however, if the mask character is not the same character as represented by the first byte of the message, a "0" is assigned to the first position of the mask byte 30b. The same comparison is made between the mask character 30a and each other byte of the original message shown in FIG. 3b. Using our example, the mask character, "char1" is compared with the first byte of the message shown in FIG. 3b, which is "char1". Since they are the same character, a "1" is assigned to the first position of the mask byte. The mask character, "char1", is compared with the second byte and the third byte of the original message, "byte1" and "byte2". Since the mask character is not the same character as represented by "byte1" or "byte2", a "0" is placed in the next two positions of the mask byte. The mask character, "char1", is compared with the fourth byte and the fifth byte of the original message, "char1" and "char1". Since the mask character is the same as the character represented by the fourth and fifth bytes, a "1" is placed in the last two positions of the mask byte, yielding "10011". Therefore, the number "10011" is the mask byte 30b. The residual message 30c comprises the original message shown in FIG. 3b, but with the mask character, "char1", removed from the message. In our example, "(byte1) (byte2)" is the residual message 30c. As a result, the message of FIG. 3a is the compressed form of the message of FIG. 3b.

The original message of FIG. 3b is extracted from the compressed message of FIG. 3a in the following manner: beginning with the first position of the mask byte 30b, if a "1" appears, the mask character "char1" constitutes the first byte of the original message, otherwise, if a "0" appears, the first byte of the residual message "byte1" constitutes the first byte of the original message. Similarly, beginning with the second position of the mask byte 30b, if a "1" appears, the mask character "char1" constitutes the second byte of the original message, otherwise, if a "0" appears, if the first byte of the residual message has not been used, the first byte of the residual message constitutes the second byte of the original message. If the first byte of the residual message has been used, the second byte of the residual message constitutes the second byte of the original message.

Using our example shown in FIG. 3a, since the mask byte is "10011", the first, fourth, and fifth bytes of the original message are the mask character 30a, namely, "char1", but the second and third bytes of the original message are the remaining parts of the residual message, namely, (byte1) and (byte2), respectively.

Referring to FIG. 3c, the process of continually and repeatedly compressing message data is illustrated. As noted previously, the compression algorithm of the present invention is capable of continually and repeated compressing data until the data is no longer compressable. That is, when the message data ceases to become smaller during the process of compression, but in fact starts to become larger during the process of compression, the smallest message data is utilized for transmission from one data processing system to another.

Referring to FIG. 3c (1), a message "(message)" is first compressed to a form "(ch1) (mb1) (rm1)", where (ch1) is the mask character, (mb1) is the mask byte, and (rm1) is the residual message, as shown in FIG. 3c (2). The residual message (rm1) of FIG. 3c (2) is further compressed to a form "(ch2) (mb2) (rm2)", where (ch2) is the mask character for the residual message (rm1), (mb2) is the mask byte for residual message (rm1), and (rm2) is the residual message for the first residual message (rm1), as shown in FIG. 3c (3). The residual message (rm2) of FIG. 3c (3) is further compressed to a form "(ch3) (mb3) (rm3)", where (ch3) is the mask character for the residual message (rm2), (mb3) is the mask byte for the residual message (rm2), and (rm3) is the residual message for residual message (rm2), as shown in FIG. 3c (4). If further compression of the message shown in FIG. 3c (4) yields a larger rather than a smaller message, the compressed message shown in FIG. 3c (4) is transmitted from a first data processing system 10 to a second data processing system 20, as shown in FIG. 1.

The message "(message)", as shown in FIG. 3c (1) is often preceded by a length indicator "(LL)" and a modulus number "(abcde)". The indicator "(LL)" is a number which denotes the actual length of the message "(message)", and the modulus number "(abcde)" is a number which denotes a reference length. If the length indicator "(LL)" is greater than the modulus number "(abcde)", the compression algorithm of the present invention compresses the message data. However, if the length indicator "(LL)" is not greater than the modulus number "(abcde)", the compression algorithm of the present invention does not compress the original message data, rather, the original message data is transmitted across a data channel from data processing system 10 to data processing system 20 without compression.

Figure 4:
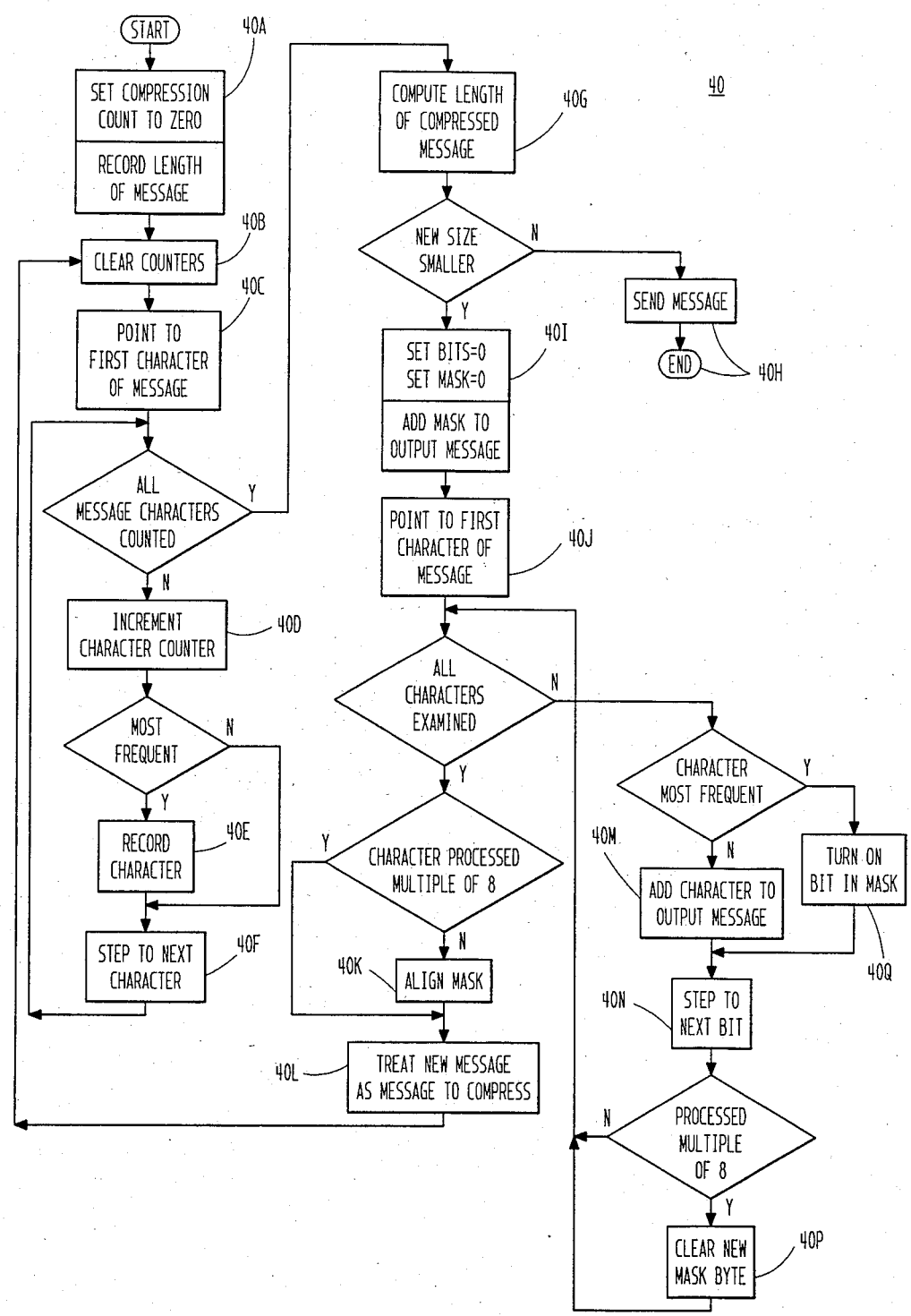
FIG. 4 illustrates a flowchart of the compression algorithm of the present invention.

Referring to FIG. 4, a flowchart of the compression algorithm stored in memory 10a and in memory 20a is illustrated. In FIG. 4, the algorithm begins by setting a count to zero and recording the length of the message to be compressed, block 40a. The counters are cleared, block 40b. Point to the first character of the message, block 40c. If all message characters are not counted, increment the character counter, block 40d. If the most frequently used character has been identified, record the character, block 40e, and step to the next character, block 40f. If the most frequently used character has not been identified, step to the next character, block 40f. If all message characters are counted, compute the length of the compressed message, block 40g. If the new size is not smaller, send message, and end, block 40h. If the new size is smaller, set bits=0 and mask=0 and add the mask to the output message, block 40i. Point to the first character of the message, block 40j. If all characters are examined, but the characters processed are not a multiple of 8, align the mask, block 40k, and treat the new message as a message to compress, block 40L. Go to block 40b and repeat steps. If the characters processed are a multiple of 8, treat the new message as a message to compress, block 40L, and go to block 40b. If all characters are not examined, and the most frequent character has not been identified, add the current character to the output message, block 40M. Step to the next bit, block 40N. If the characters processed are a multiple of 8, clear a new mask byte, block 40P and repeat the question "are all characters examined?". If the characters processed are not a multiple of 8, repeat the question "are all characters examined?". If all characters are not examined, and the most frequent character has been identified, turn on the bit in the mask, block 40Q, and repeat the question "are the characters processed a multiple of 8".

Figure 5:
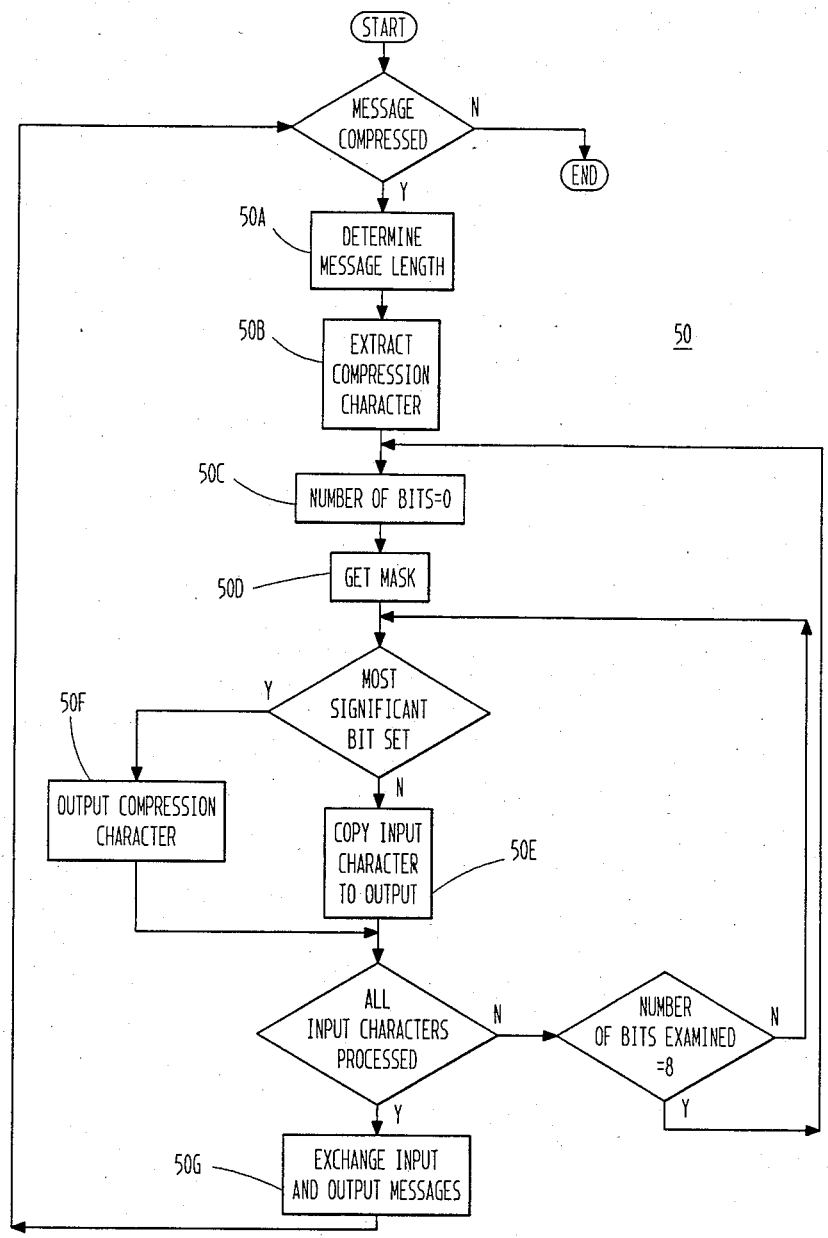
FIG. 5 illustrates a flowchart of the de-compression algorithm of the present invention.

Referring to FIG. 5, a flowchart of the decompression algorithm 50, stored in memory 10a and 20a, is illustrated. In FIG. 5, the decompression algorithm determines if the received message is compressed. If it is, the message length is determined, block 50a. The compression character is extracted, block 50b. Set the number of bits equal to zero, block 50c. Get the mask, block 50d. If the most significant (M.S.) bit is not set, copy the input character to the output, block 50e. If the M.S. bit is set, output the compression character, block 50f. If all input characters are not processed, and the number of bits to be examined are not equal to 8, repeat the question "Is the most significant bit set?", and repeat steps 50e or 50f, depending upon whether the M.S. bit is set. If all input characters are not processed, but the number of bits to be examined are equal to 8, go to block 50c and repeat the sequence of steps as outlined above. If all input characters are processed, exchange input and output messages, block 50g, and go the beginning of the decompression algorithm, repeating the question "is the message compressed?".

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A data processing system, comprising:
   a memory for storing instructions;
   input/output means for transmitting data to another data processing system; and
   processing means connected to said memory and to said input/output means for processing said instructions stored in said memory and developing a set of data, said processing means repeatedly compressing said set of data, thereby producing a compressed set of data, utilizing a compression algorithm stored in said memory and transmitting said compressed set of data to said another data processing system,
   said compression algorithm compressing said set of data thereby forming a further set of data and repeatedly re-compressing said further set of data until a previously compressed set of data and a subsequently compressed set of data is formed, a length of the subsequently compressed set of data being greater than a length of the previously compressed set of data, said previously compressed set of data being said compressed set of data transmitted to said another data processing system.

2. The data processing of claim 1, wherein said compression algorithm compresses said set of data by:
identifying a mask character in said set of data representing the most frequently occurring character in said set of data,
developing a mask byte in association with said mask character, said mask byte identifying the locations of said mask character in said set of data and identifying the locations of each portion of a residual message associated with said set of data,
developing said residual message, said residual message being said set of data having said mask character extracted therefrom, and
concatenating said mask character, said mask byte, and said residual message forming said further set of data.

3. The data processing system of claim 2, wherein said compression algorithm re-compresses said further set of data by:
developing new mask characters, new mask bytes and new residual messages from said residual message, and concatenating mask characters, mask bytes, and the new residual messages, and
in the event said previously compressed set of data and said subsequently compressed set of data have not yet been formed, developing further new mask characters, further new mask bytes and further new residual messages initially from said new residual messages and concatenating mask characters, mask bytes and the further new residual messages until said previously compressed set of data and said subsequently compressed set of data is formed.

4. A system for compressing and decompressing a set of data, comprising:
means responsive to the set of data for identifying a mask character, for developing a mask byte, for developing a residual message, and for concatenating said mask character, said mask byte, and said residual message to form a set of compressed data, the mask character representing the most frequently occurring character in said set of data,
the mask byte identifying the locations of said mask character in said set of data and identifying the locations of each portion of the residual message associated with said set of data,
the residual message being said set of data having said mask character extracted therefrom,
said means developing a new mask character, a new mask byte, and a new residual message in response to said residual message thereby forming a compressed residual message, said means concatenating said mask character, said mask byte, and said compressed residual message to form a new set of compressed data.

5. The system of claim 4, wherein said means decompresses said set of compressed data thereby creating said set of data therefrom using said mask character, said mask byte, and said residual message.

6. A method of compressing a set of data until a desired set of data is formed, comprising the steps of:
compressing said set of data thereby forming a compressed set of data; and
repeatedly re-compressing said compressed set of data until a previously compressed set of data and a subsequently compressed set of data is formed, a length of the subsequently compressed set of data being greater than a length of the previously compressed set of data, said previously compressed set of data being said desired set of data.

7. The method of claim 6, wherein the compressing step comprises the steps of:
identifying a mask character in said set of data representing the most frequently occurring character in said set of data;
developing a mask byte in association with said mask character, said mask byte identifying the locations of said mask character in said set of data and identifying the locations of each portion of a residual message associated with said set of data;
developing said residual message, said residual message being said set of data having said mask character extracted therefrom; and
concatenating said mask character, said mask byte, and said residual message to form the compressed set of data.

8. The method of claim 7, wherein the step of repeatedly re-compressing said compressed set of data comprises the steps of:
(a) developing a new mask character, a new mask byte, and a new residual message in response to said residual message thereby forming a compressed residual message;
(b) concatenating mask characters, mask bytes, and compressed residual messages;
(c) in the event step (b) does not result in the formation of said previously compressed set of data, repeating steps (a) and (b) initially using the new residual message until said previously compressed set of data is formed;
(d) developing a further new mask character, a further new mask byte, and a further new residual message in response to the residual message of said previously compressed set of data thereby forming a further compressed residual message; and
(e) repeating step (b) using said further compressed residual message to form said subsequently compressed set of data.

* * * * *